(12) United States Patent
Monaghan

(10) Patent No.: US 6,383,565 B1
(45) Date of Patent: *May 7, 2002

(54) VAPOR DEPOSITION COATING APPARATUS

(75) Inventor: Dermot Patrick Monaghan, Near Chorley (GB)

(73) Assignee: Gencoa Limited, Liverpool (GB)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/341,072
(22) PCT Filed: Jan. 7, 1998
(86) PCT No.: PCT/GB98/00047
§ 371 Date: Sep. 13, 1999
§ 102(e) Date: Sep. 13, 1999
(87) PCT Pub. No.: WO98/31041
PCT Pub. Date: Jul. 16, 1998

(30) Foreign Application Priority Data

Jan. 7, 1997 (GB) .............................. 9700158

(51) Int. Cl.$^7$ ..................... C23C 16/00; C23C 14/34
(52) U.S. Cl. ............... 427/248.1; 118/723 MP; 118/723 E; 204/298.2; 204/298.21; 204/298.22
(58) Field of Search ............... 204/298.16, 298.17, 204/298.2, 298.21, 298.22, 298.26; 427/248.1; 118/723 MP, 723 E

(56) References Cited

U.S. PATENT DOCUMENTS

| 3,905,887 A | 9/1975 | Kuehnle | 204/192 |
| 4,871,433 A | * 10/1989 | Wagner et al. | 204/192.12 |
| 5,022,978 A | 6/1991 | Hensel et al. | 204/298.19 |
| 5,196,105 A | * 3/1993 | Feuerstein et al. | 204/298.19 |
| 5,439,574 A | 8/1995 | Kobayashi et al. | 204/192.12 |
| 5,907,220 A | * 5/1999 | Tepman et al. | 315/111.41 |

FOREIGN PATENT DOCUMENTS

| EP | 0 328 257 | 8/1989 | C23C/14/56 |
| JP | 59 172 225 | 9/1984 | H01F/41/18 |
| JP | 63 262 462 | 10/1988 | C23C/14/36 |

OTHER PUBLICATIONS

English translation of JP 62–80266, Apr. 13, 1987.*
JP 62–80266 abstract, Apr. 1987.*
EPO Search Report RS 99260 GB.

* cited by examiner

Primary Examiner—Nam Nguyen
Assistant Examiner—Steven H. Ver Steeg
(74) Attorney, Agent, or Firm—Testa, Hurwitz & Thibeault, LLP

(57) ABSTRACT

The invention relates to a vapor deposition coating apparatus. More particularly it relates to an apparatus in which the ion current density is carefully controlled to improve coating. This control enhances the versatility and enlarges the range of deposition conditions which can be achieved within a single apparatus, so that coatings with very different properties can be deposited in the same equipment. The vapor deposition apparatus includes a vacuum chamber, at least one coating means or ionization source disposed at or about the periphery of a coating zone, one or more internal magnetic means positioned such that the magnetic field lines are generated across the coating zone and means for altering the strength or position of the magnetic field lines to aid confinement.

18 Claims, 11 Drawing Sheets

VAPOR DEPOSITION COATING APPARATUS

TECHNICAL FIELD

This invention relates to a vapor deposition coating apparatus. More particularly it relates to an apparatus in which the ion current density is carefully controlled to improve coating. This control enhances the versatility and enlarges the range of deposition conditions which can be achieved within a single apparatus, so that coatings with very different properties can be deposited in the same equipment. Also, the present invention enables high quality coatings to be deposited in a large volume apparatus improving the coating productivity and component throughput. The deposition apparatus is based upon magnetron sputtering sources in which the ion current driven towards the samples is carefully controlled.

BACKGROUND ART

Magnetron sputtering is a very well established technique which is able to produce high quality vapor deposited coatings for a wide range of applications.

A number of improvements in magnetron sputtering have occurred during the last ten years. The first break through was provided by the unbalanced magnetron [B. WINDOWS, N. SAVVIDES, J. Vac. Sci. Technol., A4 (1986) 453] which improved the ion flux escaping the magnetron surrounding so the samples to be coated were subjected to a higher ion bombardment with beneficial effects in the structure of certain types of coatings. Variations in this principle and control modes for the degree of unbalancing have been previously disclosed [W. MAASS, B. CORD, D. FERENBACH, T. MARTENS, P. WIRZ, Patent DE 3812379 Apr. 14, 1988].

In the case of large volume coating apparatus it has been necessary to provide high ionization sources in areas well away from the magnetron. This extra ionization has been implemented by the use of supplementary excitation sources such as radio-frequency and microwave means [M. NIHEI, J. ONUKI, Y. KOUBUCHI, K. MIYAZAKI, T. ITAGAKI, Patent JP 60421/87 Priority Mar. 16, 1988] and the provision of magnetic arrangements next to the magnetron sources [D. G. TEER, Proceedings for the First International Symposium on Sputtering and Plasma Processing—ISSPO91, Tokyo, Japan, February 1991; and A. FEUERSTEIN, D. HOFMANN, H. SCHUSSLER, Patent DE 4038497 Priority Dec. 3, 1990, and S. KADLEC, J. MUSIL, Patent CS4804/89, Priority Aug. 14, 1989; and W. D. MÜNZ, F. J. M. HAUZER, B. J. A. BUIL, D. SCHULZE, R. TIETEMA, Patent DE 4017111 Priority May 28, 1990]. All described methods have had a limitation in the maximum chamber size, generally limited to 0.5 to 1 meters in diameter, that can be used for the deposition of a successful coating.

The present invention overcomes such a limitation and can give rise to a novel apparatus which could be up to four meters in diameter.

DISCLOSURE OF THE INVENTION

According to one aspect of the present invention there is provided a vapor deposition coating apparatus comprising a vacuum chamber, at least one coating means or ionization source disposed at or about the periphery of a coating zone, characterized in that the apparatus is provided with one or more internal magnetic means positioned such that magnetic field lines are generated across the coating zone and means for altering the strength or position of the magnetic field lines.

According to a further aspect of the present invention there is provided a multi-station deposition unit comprising a plurality of coating stations each defining a confinement volume, the unit comprising a plurality of coating means or ionization sources disposed at or about the periphery of the coating zone and one or more internal magnetic means positioned such that magnetic field lines are generated across each coating zone and means for altering the strength or position of the magnetic field lines.

According to yet a further aspect of the present invention there is provided a vapor deposition coating method characterised in that magnetic field lines can be regulated across a coating zone by means which enable an ion current density to be controlled.

The apparatus can incorporate a number of coating means of which one is preferably a magnetron cathode which will be situated around the samples to be coated. At or towards the interior of the chamber a single or plurality of means generate a magnetic field. These means could comprise a single or plurality of magnetic polarities which could be the same or different to those of the outer magnetic array of the magnetron source. These magnetic sources provide a means enabling deposition under different ion bombardment conditions to be controlled in different areas of the coating apparatus and/or at different times in the deposition process.

The magnetic strength of these poles could be controlled by different means, e.g. by changing the current of the electromagnet units or by mechanical displacement of the permanent magnetic means or both.

Identical or different magnetron polarities could be used within the same apparatus.

The magnetic strength of the magnetrons could be also varied as could the relative position of the inner and outer magnetic poles.

Auxiliary magnetic poles could be used in the chamber surroundings in order to optimize the plasma confinement. Magnetic confinement enhancement could be achieved by magnetic means which present opposite polarity to the central pole. Also suitable electric currents could provide adequate magnetic confinement by generating magnetic fields for this purpose, especially when they are combined with other magnetic means.

All these magnetic variations make the apparatus versatile in its applications.

Generally, the apparatus will enable maximum magnetic confinement necessary in larger deposition apparatus to ensure high quality coatings. The internal magnetic means could have independent biasing from the samples to be coated. The samples to be coated could be biased or un-biased. The bias applied to the samples to be coated could be powered by direct current (DC) and alternative excitation means at different frequencies such as alternating current (AC) at very low frequencies (1–1000 Hz), or pulsed voltages at low frequencies (Pulsed-LF) (1–1000 KHz), or medium frequency (MF) waves (1–3 MHz),or radiofrequencies (RF) waves (1–1000 MHz), or any combination or modulation of these or other excitation means.

The apparatus could incorporate any other number of means in order to enhance the ionization such as microwaves and/or medium and high frequency devices and means suitable for the generation of glow discharges and ion vacuum techniques such as arcs, hot filament, lasers, electron guns and ion beams.

Larger apparatus, above two meters in diameter can be produced by magnetic linkage between magnetrons and internal poles. Spatial distribution of magnetrons and additional magnetic means could be varied in order to achieve optimization of spaces where magnetic confinement conditions are appropriate for coating depositions. A large coating apparatus could comprise of one or more confinement areas or stations.

Various aspects of the invention will be described, by way of example only with reference to FIGS. 1 to 11 below in which.

Figure 1:
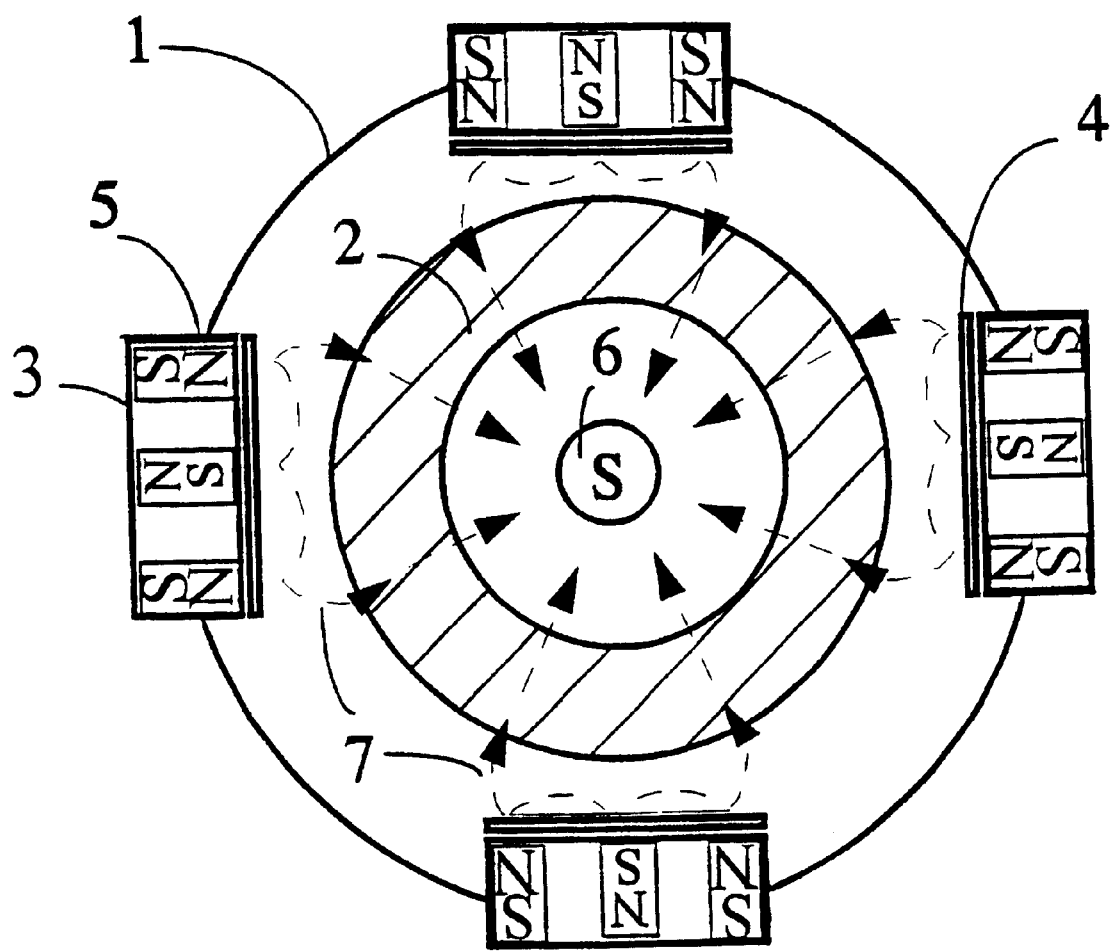
FIG. 1 shows an example of a deposition apparatus which includes the basic magnetic confinement described by the present invention.

Referring to the figures in turn:

FIG. 1 represents the top view of a cylindrically shaped chamber. The deposition unit includes a vacuum chamber 1, which is evacuated by means of a pumping system. The elements due for coating in the coating 2 one 2 could rotate so they could face the different magnetrons 3 or other possible coating means or ionization sources. The sputtering process takes place on the surface of the magnetron targets 4. The front face of the outer magnetic pole 5 of the magnetrons 3 have opposite polarity to the central magnetic means 6 placed at the central zone of the chamber so that the magnetic field lines 7 cross the zone of elements due for coating in the coating zone 2. The magnetic poles contained within the magnetron may or may not have one or several ferromagnetic elements, such as a soft iron backing plate, at the rear of the magnetic pole. The vacuum chamber 1, could be constructed from non-ferromagnetic or ferromagnetic material in order to either affect or not affect the magnetic circuits.

Figure 2:
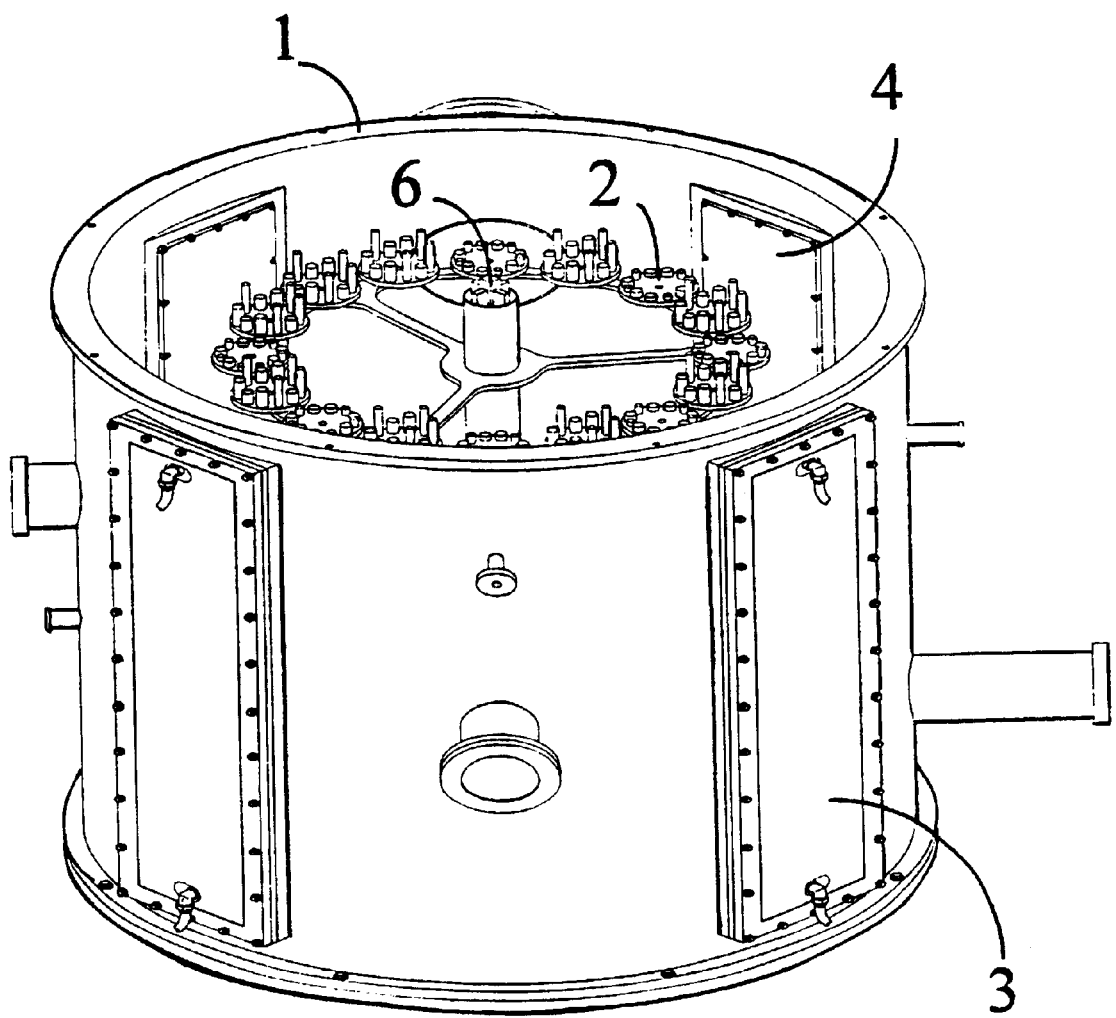
FIG. 2 illustrates a three-dimensional view of a deposition chamber described by the present invention.

FIG. 2 represents a deposition apparatus where the magnetrons 3 are placed on the wall of chamber 1. A central magnetic means 6 is placed within a central pole. Samples located in coating zone 2 are coated with material from the magnetron targets 4 or any other chemical compounds formed in plasma reactions during the deposition process.

Figure 3:
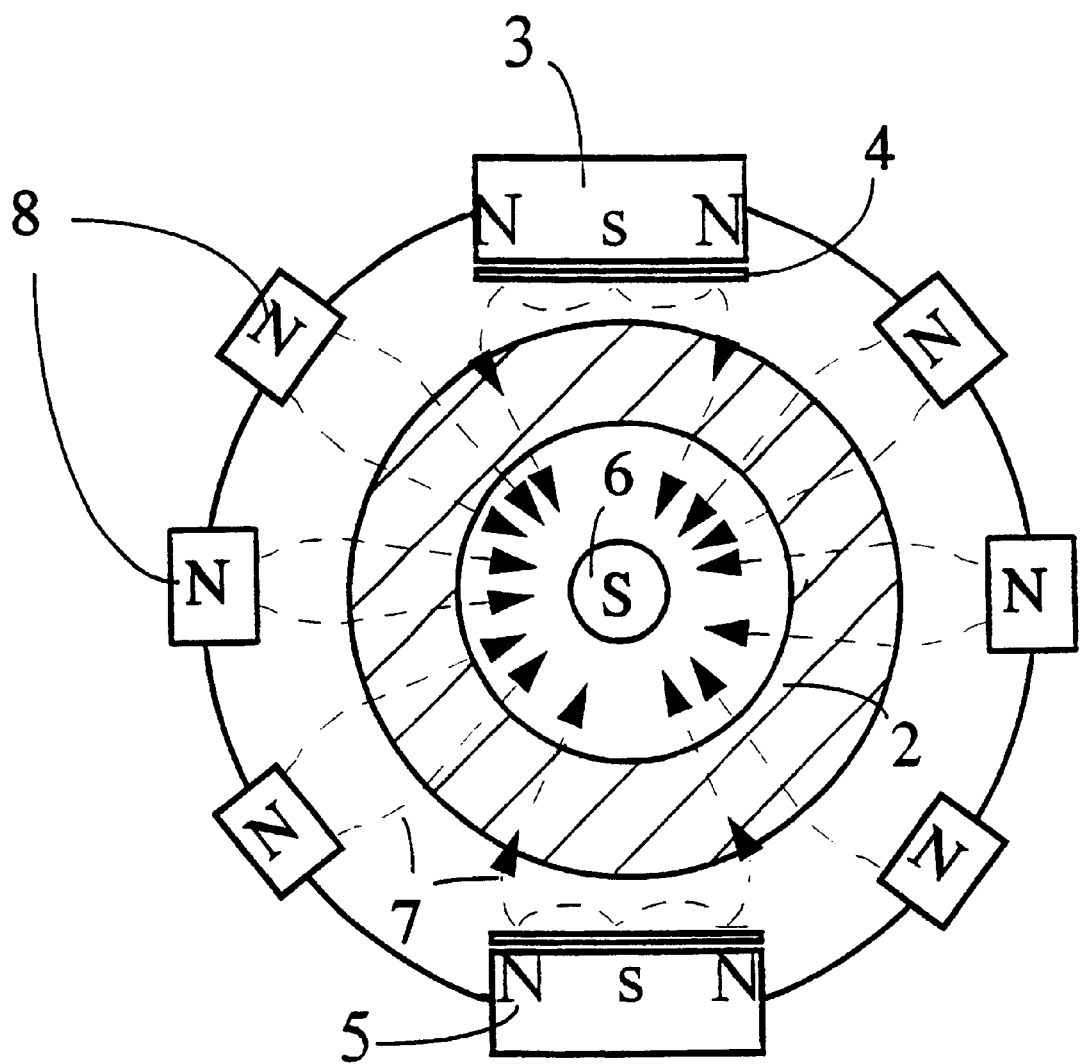
FIG. 3 illustrates a deposition unit described by the present invention which has additional magnetic means.

FIG. 3 represents a top view of a two magnetron apparatus where the central magnetic means 6 has an opposite magnetic polarity to that of the outer magnetic means 5 of the magnetrons 3. Additional magnetic means 8 situated around the samples, e.g. by the chamber walls, provide magnetic fields which complement and enhance magnetic confinement within the system so magnetic field lines 7 cross the samples in the coating zone 2 towards the central pole.

Figure 4:
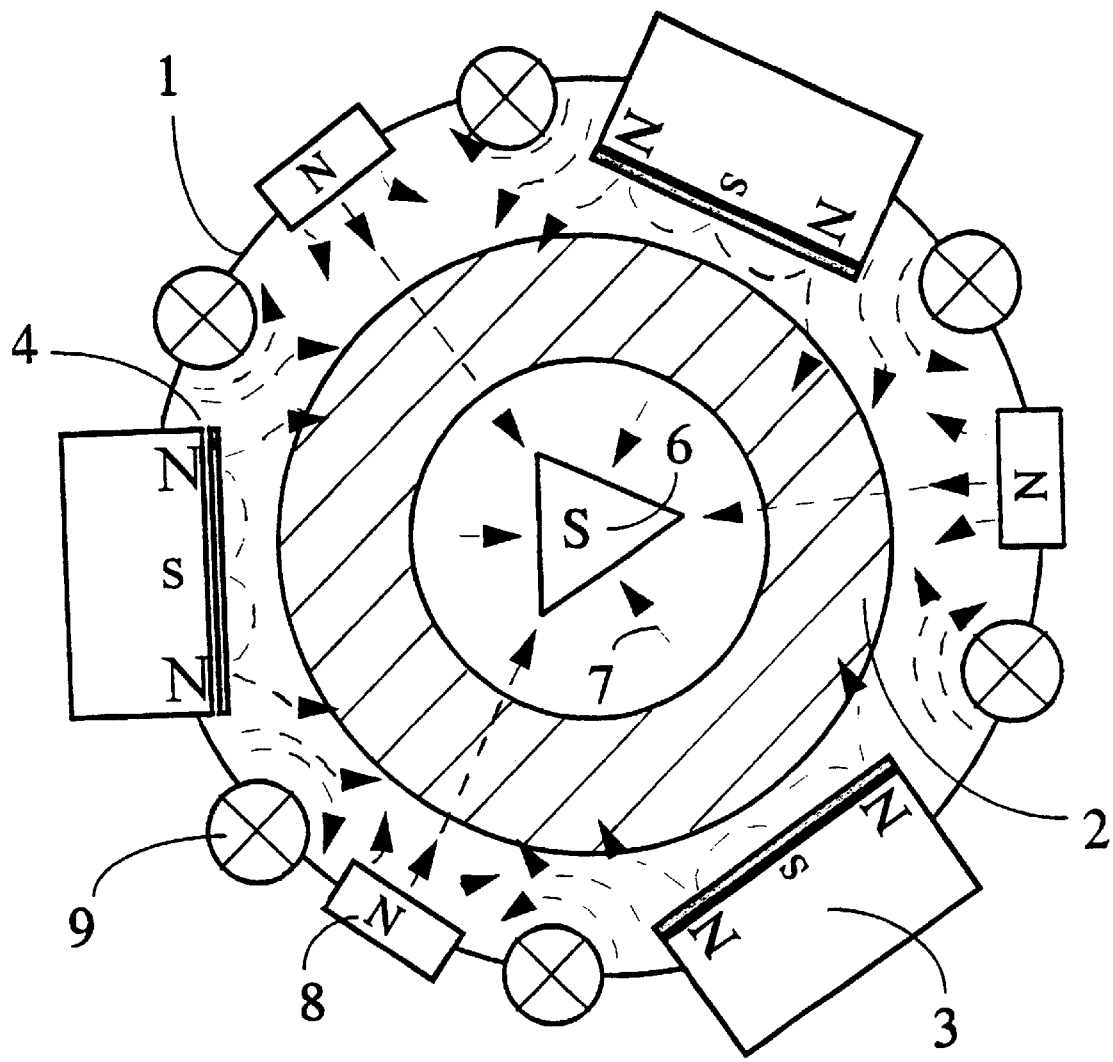
FIG. 4 illustrates a deposition unit with additional magnetic means which could modulate the magnetic confinement as described by the present invention.

FIG. 4 represents a top view of a three magnetron apparatus where the central magnetic means 6 has an opposite polarity to that of the outer magnetic means 5 of the magnetrons 3. Additional magnetic means 8 and 9 enhance confinement. Central magnetic means 6 and additional magnetic means 9 could be varied either by mechanical displacement or electronic currents so that the degree of confinement could be modulated as magnetic fields lines 7 are altered.

Figure 5:
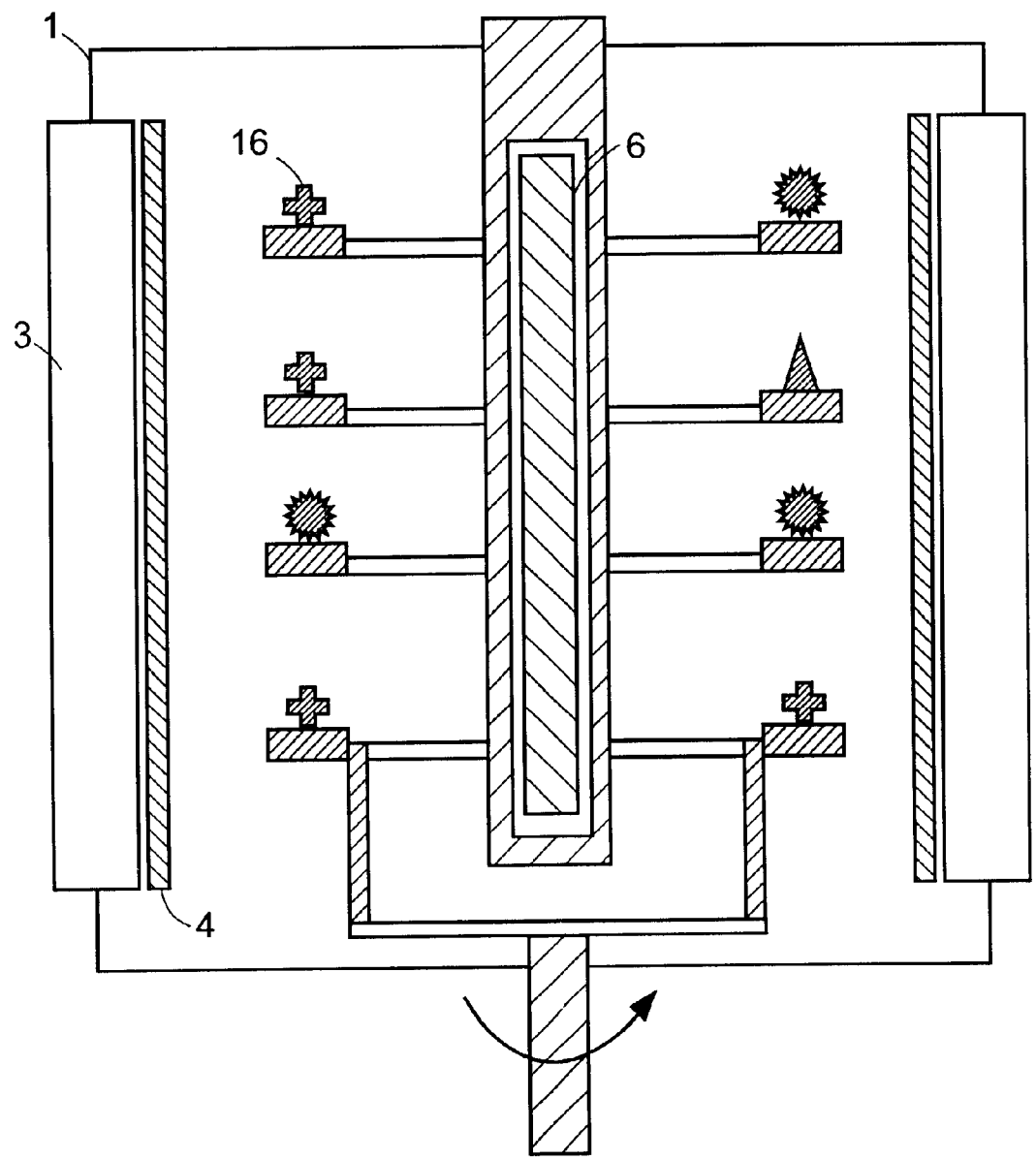
FIG. 5 illustrates a cross section of a deposition unit with independent biasing for the central magnetic mean from the samples as described by the present invention.

FIG. 5 represents a cross sectional view of a deposition apparatus where the central magnetic means 6 could be independently biased from the samples 16. This magnetic array could be left at a floating potential (where electronic current is equal to the ionic current), or biased at the same or a different potential to that of the samples with a positive or negative polarity. The samples could be biased by for example DC, AC, Pulsed-LF, MF, RF or any combination or modulation of the above.

Figure 6:
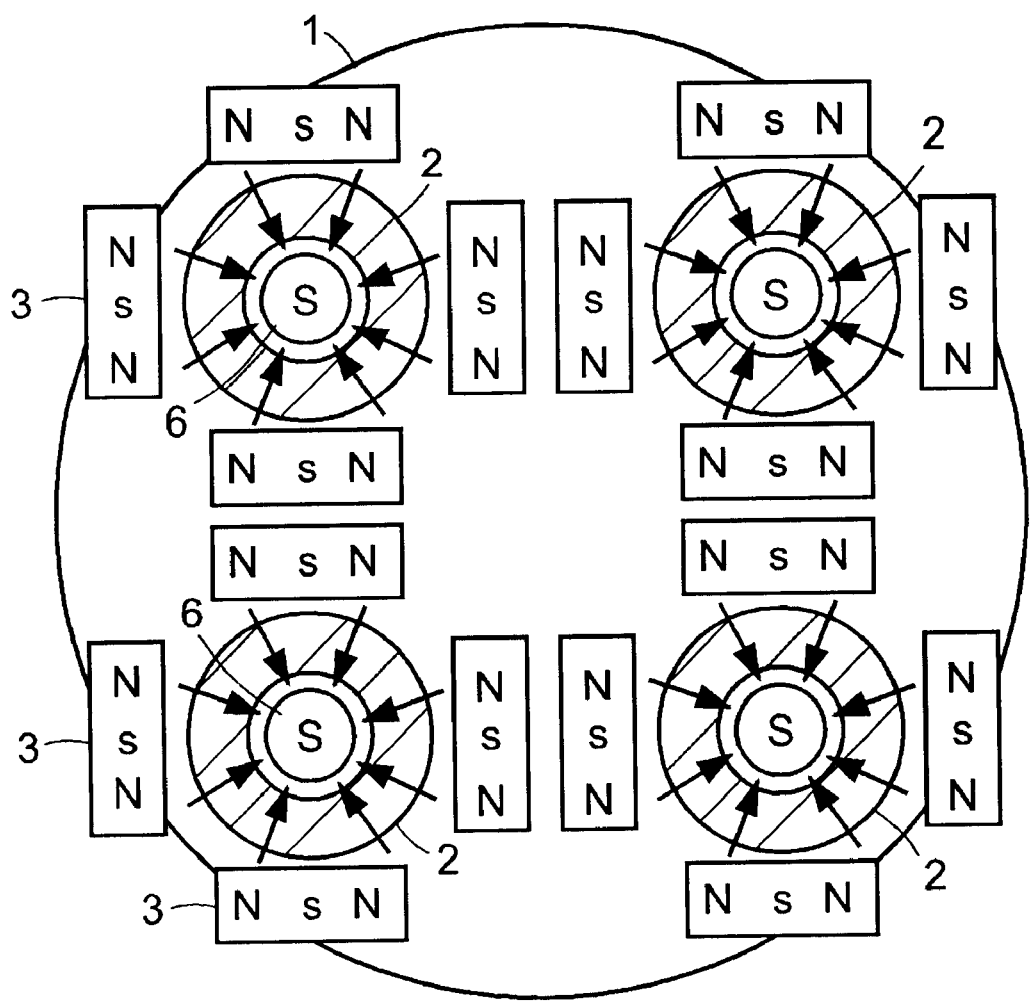
FIG. 6 shows a multi-station deposition unit described by the present invention.

FIG. 6 represents a multi-station coating apparatus where the deposition units comprise four different coating stations which provide four different confinement volumes. Each station, in the present example, has different magnetrons 3 and coats different samples in local coating zone 2. Magnetic confinement is produced between magnetrons 3 and a local central magnetic pole 6.

Figure 7:
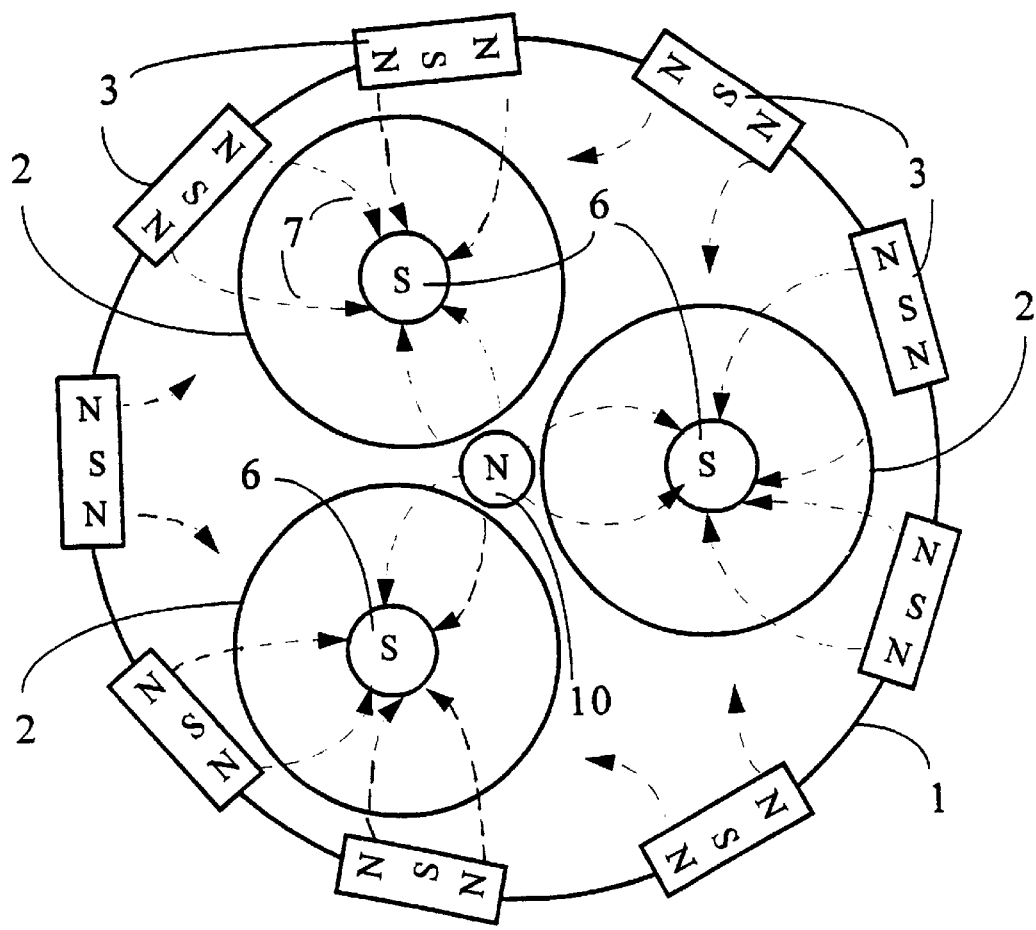
FIG. 7 represents a multi-station deposition unit described by the present invention.

FIG. 7 represents a multi-station coating apparatus. The deposition apparatus comprises three different coating zones 2. In the present example all the magnetrons are situated on the walls of the chamber 1. Two series of magnetic poles 6 and 10 of opposite polarity direct the magnetic field lines 7 across the samples.

Figure 8:
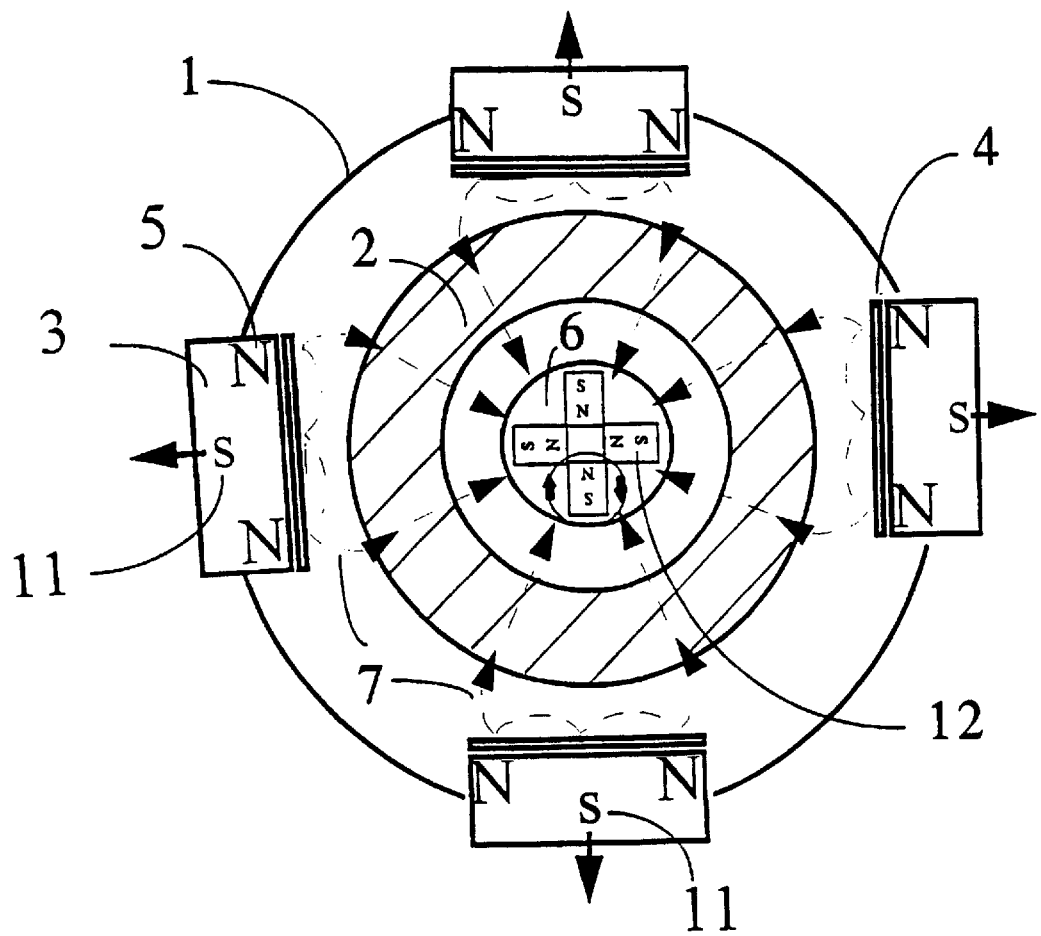
FIG. 8 illustrates a system with higher levels of magnetic confinement made by retracting to some degree the inner magnetron magnetic pole as described by the present invention.

FIG. 8 represents a single station coating apparatus with the magnetrons inner magnetic means 11 being withdrawn independently of the magnetrons outer magnetic means 5 so as to further enhance the magnetic linkage shown by magnetic field lines 7 to the central magnetic means 6 and the magnetrons outer magnetic means 5. Central magnetic means 6, as an example, comprises a number of independently controllable magnetic means 12 each of which can independently have its polarity changed by for example rotation and/or translation of their constitutive permanent magnets.

Figure 9:
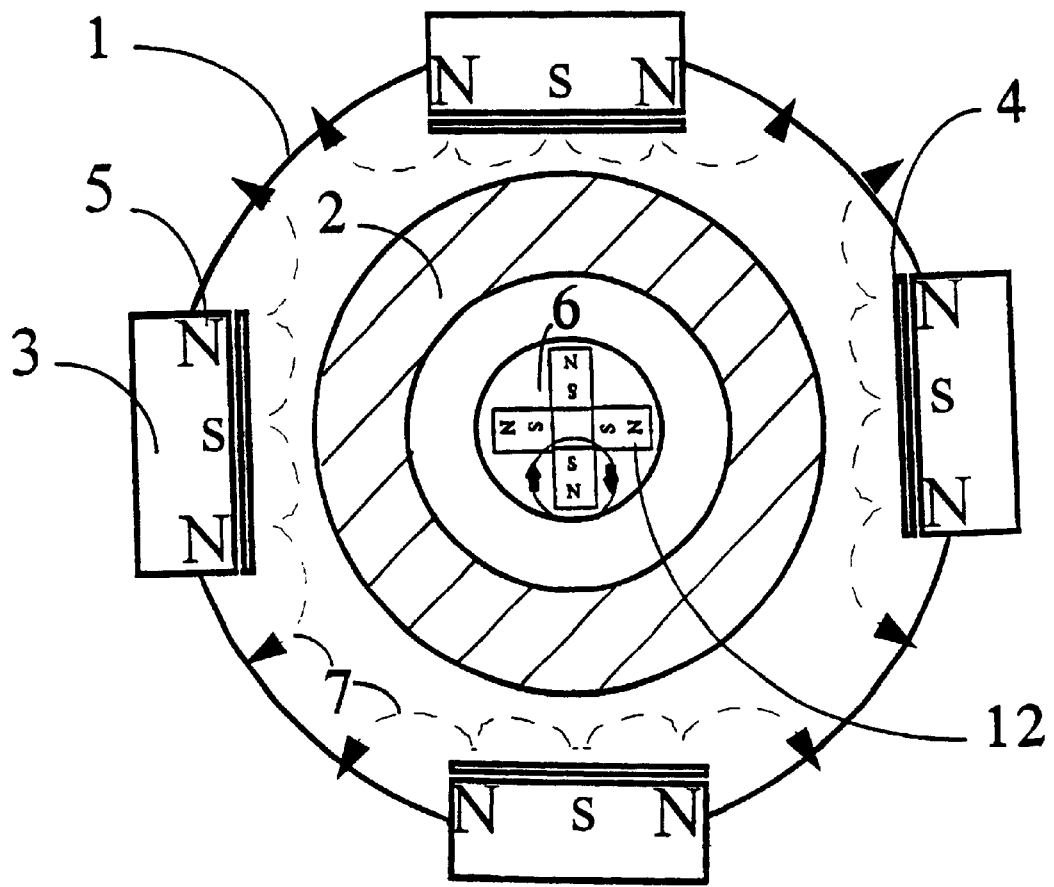
FIG. 9 illustrates a system with low levels of magnetic confinement brought about by the switching of the central polarity such that it is the same as the outer pole of the magnetron as described by the present invention.

FIG. 9 represents a single station apparatus where the independently controllable magnetic means 12 have been reversed such that the polarity is the same as the magnetrons outer magnetic means 5, hence having the effect of preventing linkage with the magnetic pole of the central magnetic means.

Figure 10:
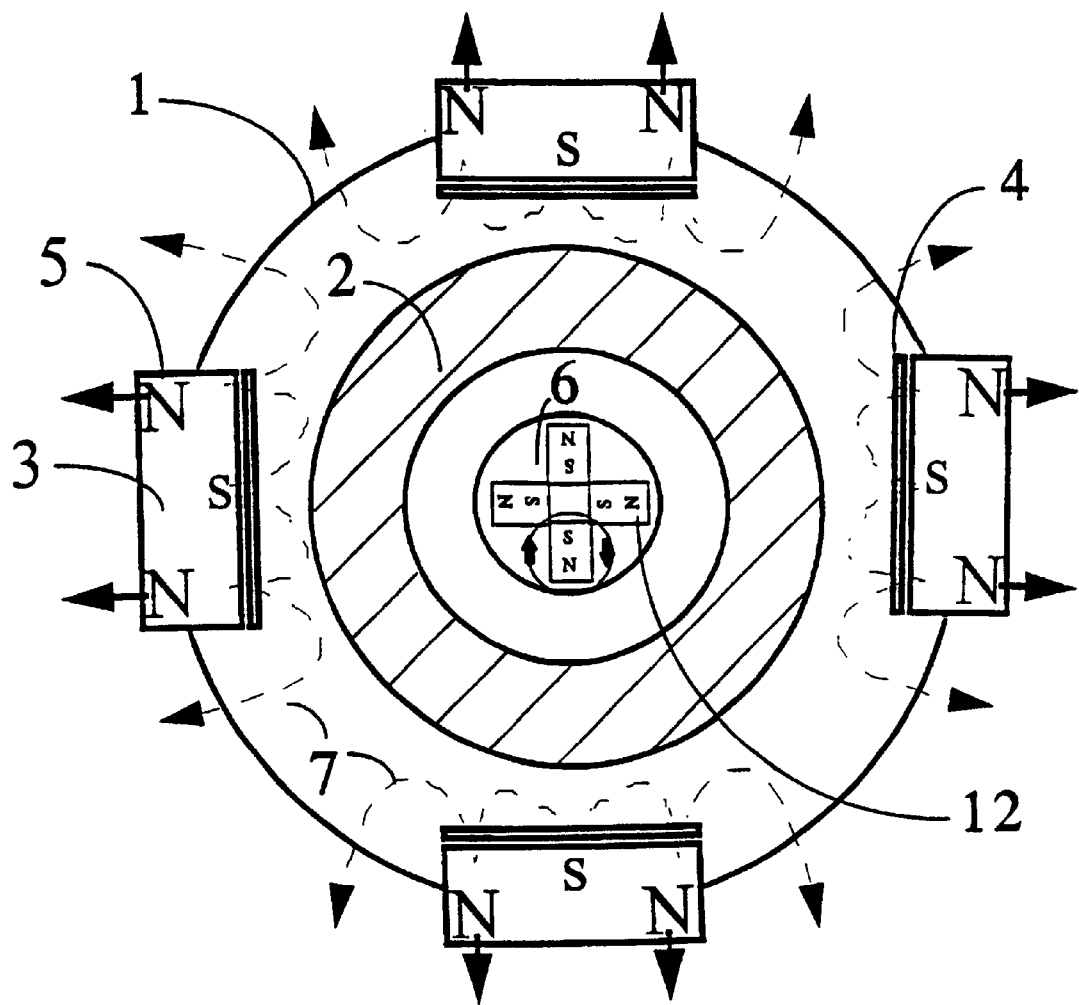
FIG. 10 illustrates a system with very low levels of magnetic confinement which are further decreased by withdrawing the magnetrons outer magnetic pole to some degree as described by the present invention.

FIG. 10 represents a single station coating apparatus where the independently controllable magnetic means 12 have been reversed such that the polarity is the same as the magnetrons outer magnetic means 5, with the further retraction of the magnetrons outer magnetic means 5 increasing the effect of preventing linkage with the magnetic pole of the central magnetic means.

Figure 11:
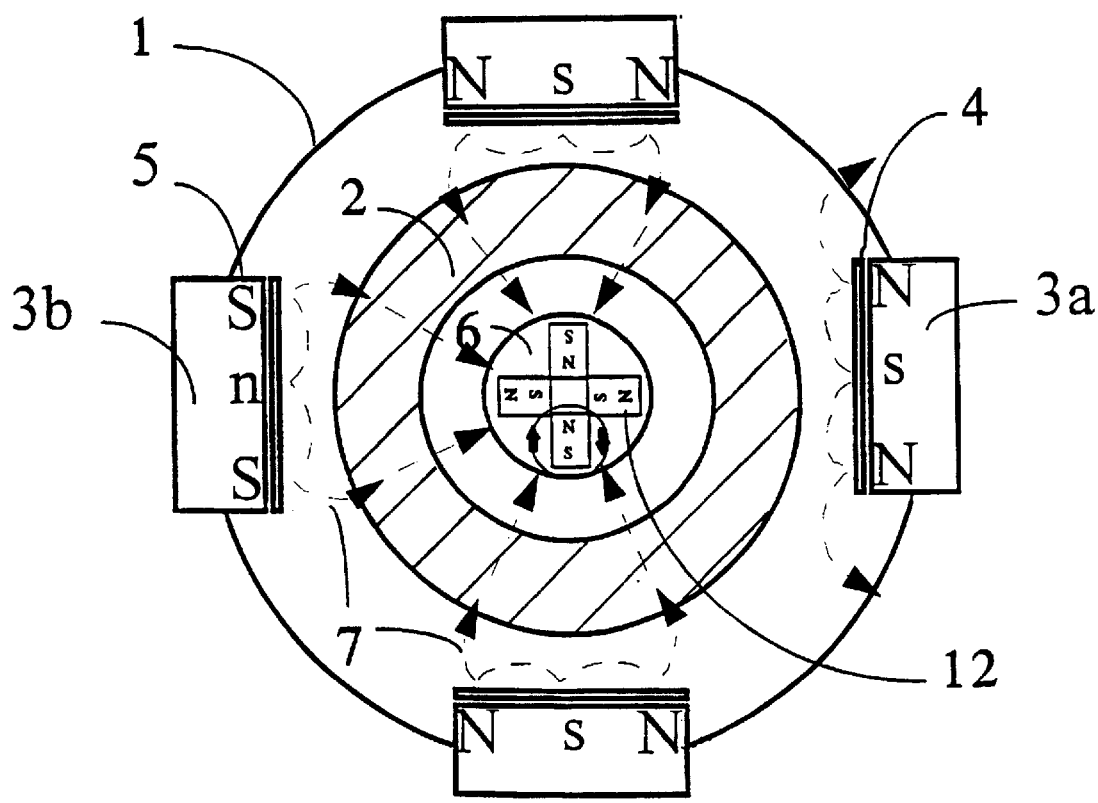
FIG. 11 illustrates a system with different levels of magnetic confinement for different areas of the coating station as described by the present invention.

FIG. 11 represents a single station coating apparatus where the independently controllable magnetic means 12 have two different polarities. At the same time the magnetrons have two different polarities 3a and 3b, providing different magnetic confinement in different areas of the station. This situation allows coating deposition at different degrees of ion bombardment. Magnetron targets 4 could be of the same or of different materials. In the present example three of the magnetrons present a magnetic confinement due to complementary polarity with the central magnetic means. One of the magnetrons presents the same polarity as the corresponding central magnetic mean preventing linkage with the magnetic pole of central magnetic means.

What is claimed is:

1. A vapor deposition coating apparatus comprising a vacuum chamber comprising:
    at least one coating zone in which samples are coated;
    a coating means comprising at least two magnetron cathodes disposed at or about an outer periphery of the coating zone; and
    at least one magnetic means disposed at or about an inner periphery of the coating zone, the magnetic means independently biased from a sample to be coated in the coating zone, the magnetron cathodes having outer magnetic poles of opposite polarity to the magnetic means so that magnetic field lines cross the coating zone, and said apparatus further comprising means for altering strength or position of the magnetic field lines.

2. An apparatus as claimed in claim 1 in which the coating zone is annular.

3. An apparatus as claimed in claim 1 in which the magnetic means is a permanent magnet.

4. An apparatus as claimed in claim 1 in which the at least one magnetic means is positioned substantially at the center of the chamber.

5. An apparatus as claimed in claim 1, wherein the at least one magnetic means comprises a single or a plurality of polarities facing the coating zone.

6. An apparatus as claimed in claim 1, wherein the means for altering the strength or position of the magnetic field lines comprises means for displacing the at least one magnetic means.

7. An apparatus as claimed in claim 1 in which the means for altering the strength or position of the magnetic field lines comprises means for altering position of at least one of the outer magnetic poles of the magnetron cathodes and the at least one magnetic means with respect to one another.

8. An apparatus as claimed in claim 1, wherein the at least one magnetic means is rotatable such that the strength or position of the magnetic field lines can be altered.

9. An apparatus as claimed in claim 1, wherein the at least two magnetron cathodes each comprise an inner magnetic means of one polarity and an outer magnetic means of opposite polarity.

10. An apparatus as claimed in claim 9 wherein the inner magnetic means and the outer magnetic means can be withdrawn independently of each other, such that the strength or position of the magnetic field lines can be altered.

11. An apparatus as claimed in claim 1, wherein the at least one magnetic means comprises a number of independently controllable magnetic means each of which can independently have a respective polarity thereof changed such that the strength or position of the magnetic field lines can be altered.

12. An apparatus as claimed in claim 11 wherein the independently controllable magnetic means can independently have a respective polarity thereof changed by at least one of rotation and translation of respective constitutive permanent magnets thereof.

13. An apparatus as claimed in claim 1 further comprising additional magnetic means disposed between the magnetrons about the outer periphery of the coating zone such that the strength or position of the magnetic field lines can be altered.

14. An apparatus as claimed in claim 1, wherein the magnetron cathodes all have the same polarity.

15. An apparatus as claimed in claim 1, wherein the magnetron cathodes have different polarities.

16. A multi-station vapor deposition apparatus comprising:
    a vacuum chamber having at least two coating zones in which samples are coated;
    at least two magnetron cathodes disposed at or about an outer periphery of each coating zone; and
    at least one magnetic means disposed at or about an inner periphery of each coating zone, the magnetic means independently biased from a sample to be coated in the coating zone, the magnetron cathodes having at least two outer magnetic poles of opposite polarity to the magnetic means so that magnetic field lines cross each coating zone, said apparatus further comprising means for altering strength or position of the magnetic field lines.

17. An apparatus as claimed in claim 16 further comprising an additional magnetic pole disposed at or about the outer periphery of the coating zone which magnetic pole is of opposite polarity to the at least one magnetic means.

18. A vapor deposition coating method comprising the steps of:
    using a magnetic means disposed at or about an inner periphery of a coating zone, providing magnetic field lines across the coating zone in a vacuum chamber of a multi-station vapor deposition apparatus;
    biasing the magnetic means independently from a substrate to be coated in the coating zone; and
    altering strength or position of the magnetic field lines across the coating zone, thereby enabling the coating of the substrate.

* * * * *